US008183915B2

(12) United States Patent
Tsukio et al.

(10) Patent No.: US 8,183,915 B2
(45) Date of Patent: May 22, 2012

(54) OSCILLATOR, AND RECEIVING DEVICE AND ELECTRONIC DEVICE USING THE OSCILLATOR

(75) Inventors: Yasunobu Tsukio, Osaka (JP); Akihiko Namba, Osaka (JP); Hiroaki Ozeki, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/151,777

(22) Filed: Jun. 2, 2011

(65) Prior Publication Data

US 2011/0260787 A1 Oct. 27, 2011

Related U.S. Application Data

(62) Division of application No. 12/671,340, filed as application No. PCT/JP2008/002004 on Jul. 28, 2008, now Pat. No. 8,040,178.

(30) Foreign Application Priority Data

Jul. 31, 2007 (JP) ................................ 2007-198364

(51) Int. Cl.
*H03D 3/28* (2006.01)

(52) U.S. Cl. ........................ 329/325; 455/208; 455/265

(58) Field of Classification Search .................. 329/325; 455/208, 260, 265
See application file for complete search history.

(56) References Cited

U.S. PATENT DOCUMENTS 7,145,402 B2 12/2006 Mattila et al.

FOREIGN PATENT DOCUMENTS

| | | |
|---|---|---|
| JP | 62-025543 | 2/1987 |
| JP | 5-63131 | 8/1993 |
| JP | 07-245563 | 9/1995 |
| JP | 08-018477 | 1/1996 |
| JP | 2003-069426 A | 3/2003 |
| JP | 2004-128861 A | 4/2004 |
| WO | PCT/JP2008/002004 | 9/2008 |

*Primary Examiner* — Robert Pascal
*Assistant Examiner* — James E Goodley
(74) *Attorney, Agent, or Firm* — RatnerPrestia

(57) ABSTRACT

An oscillator unit is configured such that a frequency adjustment unit of a synthesizer used by a controller is smaller than a frequency variation tracking capability of a demodulator connected to an output side of a frequency converter. This structure successfully combines the temperature compensation control of an oscillator unit and the receiving process of a high-frequency receiving device. Accordingly, an oscillator unit with large temperature coefficient is applicable to high-frequency receiving devices.

2 Claims, 5 Drawing Sheets

OSCILLATOR, AND RECEIVING DEVICE AND ELECTRONIC DEVICE USING THE OSCILLATOR

This Application is a divisional of U.S. patent application Ser. No. 12/671,340, filed on Jan. 29, 2010, which is incorporated herein by reference.

TECHNICAL FIELD

The present invention relates to oscillator units that produce oscillation signals, and receiving devices and electronic devices using the oscillator unit.

BACKGROUND ART

FIG. 7 is a circuit diagram of a conventional reference oscillator. In reference oscillator 100 in FIG. 7, oscillator 101 is, for example, an AT-cut quartz crystal. Driver circuit 102 connected in parallel to oscillator 101 is configured, for example, with a CMOS inverter. Load capacitances 103 and 104 are connected to oscillator 101 and ground.

In general, the reference oscillator used for a reference frequency of communications devices, such as mobile phones, or high-frequency receiving devices, such as TV sets, require frequency stability against ambient conditions. In particular, frequency stability against temperature changes is one important performance. For example, TV sets require stability of at least ±60 ppm or less is required in a use temperature range. A structure of reference oscillator 100 is effective for achieving this performance, and crystal oscillator 101 is an essential device for equipment requiring highly accurate frequency stability.

However, crystal oscillator 101 has a structure of suspending an oscillating portion in midair while holding a part of crystal piece cut to a predetermined shape. Accordingly, downsizing is difficult. In addition, a device having the above structure needs to be manufactured one by one. This makes cost reduction difficult.

To redeem the disadvantage of reference oscillator 100 made of crystal, an oscillator using a silicon oscillator utilizing a semiconductor manufacturing process has been disclosed. A reference oscillator employing a silicon oscillator is configured in the same way as that in FIG. 7. However, since a temperature coefficient of silicon material is large, an oscillation frequency varies in line with a temperature change. Therefore, a temperature sensor is used for detecting a change in ambient temperature so as to apply temperature compensation control for retaining a constant frequency.

FIG. 8 is a block diagram of a conventional oscillator unit. In FIG. 8, conventional oscillator unit 201 includes reference oscillator 202 for generating a reference oscillation signal, synthesizer 204 for outputting a local oscillation signal based on the reference oscillation signal output from this reference oscillator 202, temperature sensor 205 for detecting temperature, and controller 206. Controller 206 adjusts a frequency of the local oscillation signal output from synthesizer 204 based on a detection result of temperature sensor 205. This controller 206 applies temperature compensation control for adjusting output frequency of synthesizer 204 based on a temperature detection result of reference oscillator 202 detected by temperature sensor 205. This prior art is disclosed, for example, in Patent Literature 1.

A temperature coefficient of silicon oscillator (not illustrated) in reference oscillator 202 is 30 ppm/° C., which is large. Therefore, a frequency adjustment level output from controller 206, corresponding to the detection result of temperature sensor 205, becomes large. As a result, a frequency variation in the local oscillation signal output from synthesizer 204 becomes large.

On the other hand, in a high-frequency receiving device, a frequency of high-frequency signal received is converted to an intermediate frequency signal, using the local oscillation signal obtained by converting a signal output from the oscillator. This is demodulated in a later process. Stable frequency without variation is thus demanded for this intermediate frequency signal. Accordingly, in case of using the oscillator in the high-frequency receiving device, a demodulator may not be able to demodulate if frequency greatly varies in the intermediate frequency signal as a result of temperature compensation control. Therefore, the oscillator unit using an oscillator with large temperature coefficient cannot be used in a field of high-frequency receiving devices, such as mobile phones and broadcast receiving tuners, even if a temperature compensation control circuit is added.

Patent Literature 1: U.S. Pat. No. 7,145,402

SUMMARY OF THE INVENTION

The present invention offers an oscillator unit that is applicable to high-frequency receiving devices even if a temperature coefficient is large.

In the oscillator unit of the present invention, frequency adjustment unit fstep of a synthesizer used by a controller is smaller than frequency variation tracking capability fv of a demodulator connected to an output side of a frequency converter.

This structure successfully combines the temperature compensation control of the oscillator unit and the receiving process of a high-frequency receiving device. Accordingly, an oscillator unit with large temperature coefficient is applicable to high-frequency receiving devices.

REFERENCE MARKS IN THE DRAWINGS

Figure 1A:
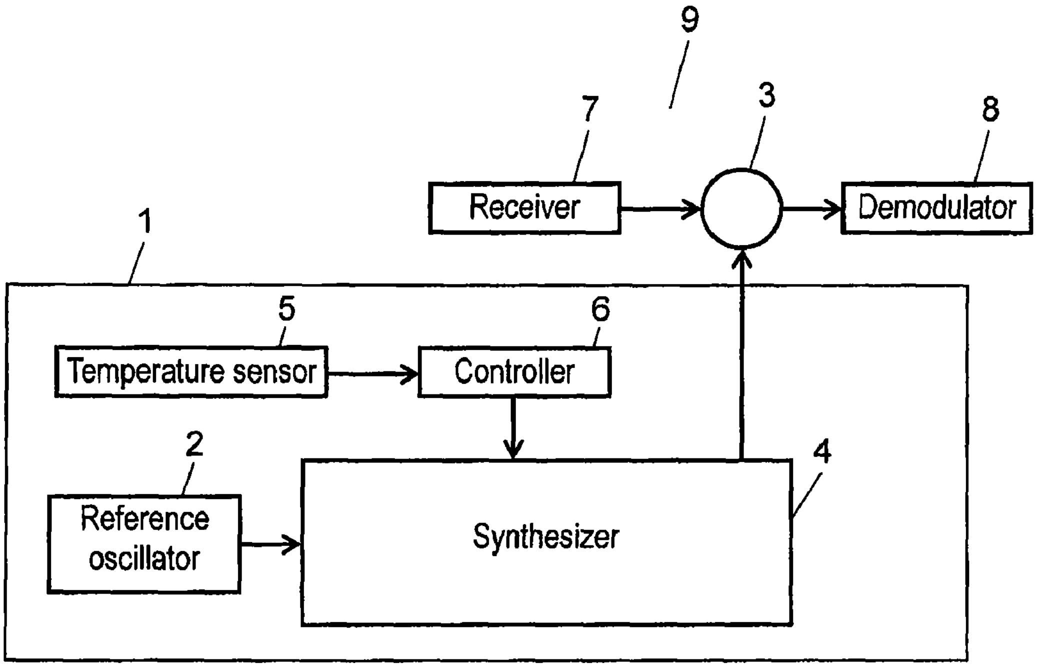
FIG. 1A is a block diagram of a receiving device equipped with an oscillator unit in accordance with a first exemplary embodiment of the present invention.

1 Oscillator unit
2 Reference oscillator

3 Frequency converter
4 Synthesizer
5 Temperature sensor
6 Controller
7 Receiver
8 Demodulator
9 Receiving device
10 Difference detector
11 M-frequency divider
12 Phase detector
13 N-frequency divider
14 VCO
15 Filter
16 Integrator
17 Computing unit
18 AD converter
19 Second frequency converter
20 Processor
21 NCO
36 First frequency converter

DETAILED DESCRIPTION OF PREFERRED EMBODIMENTS

First Exemplary Embodiment

The first exemplary embodiment of the present invention is described below.

FIG. 1A is a block diagram of a receiving device equipped with an oscillator unit in the first exemplary embodiment of the present invention. In FIG. 1A, oscillator unit 1 includes reference oscillator 2 for producing a reference oscillation signal, synthesizer 4, temperature sensor 5 for detecting temperature, and controller 6. Synthesizer 4 produces a local oscillation signal based on the reference oscillation signal output from reference oscillator 2, and outputs this local oscillation signal to frequency converter 3. Controller 6 adjusts a frequency of the local oscillation signal output from synthesizer 4 based on a detection result of temperature sensor 5.

Other than oscillator unit 1, receiving device 9 equipped with this oscillator unit 1 includes receiver 7 for receiving a high-frequency signal; frequency converter 3 connected to oscillator unit 1 and receiver 7, and producing an intermediate frequency signal; and demodulator 8 for demodulating an intermediate frequency signal.

In this structure, controller 6 calculates a frequency adjustment level, using a temperature detection result of temperature sensor 5, and controls synthesizer 4. As a result, frequency variations in synthesizer 4 can be suppressed within a predetermined range in a predetermined temperature range even if a temperature coefficient of an oscillator included in reference oscillator 2 is large. For example, when a temperature coefficient of the oscillator is 30 ppm/° C., a frequency variation will be 3600 ppm in a temperature range from −40° C. to 80° C. if there is no control using the above temperature sensor. This means that a frequency variation is as large as 3600 kHz, if the output of synthesizer 4 is, for example, 1 GHz (hereafter, the output of synthesizer 4 is "1 GHz" in the description). On the other hand, if an appropriate control is applied using temperature sensor 5, the variation can be suppressed, for example, to 0.6 ppm/° C. or below (60 kHz converted to the output of synthesizer 4). This enables suppression of frequency variation to 72 ppm (±36 ppm, 0.6 ppm/° C.×120° C.) in the temperature range from −40° C. to 80° C. However, if oscillator unit 1 is used for configuring a high-frequency receiving device, reception becomes not feasible (reception error) for a period of a few milliseconds or a few seconds in a reception period.

This happens as described below. In oscillator unit 1, controller 6 outputs a frequency adjustment level based on a detection result of temperature sensor 5. Accordingly, if a rate of resonance frequency variation is large with respect to the temperature of oscillator (not illustrated) included in reference oscillator 2 (hereafter referred to as a "frequency temperature coefficient"), the frequency adjustment level output from controller 6 dependently becomes large.

For example, let's say a resonator is a silicon oscillator. A frequency temperature coefficient of the silicone oscillator is 30 ppm/° C., and thus a resonance frequency varies for 3 ppm when the temperature changes for 0.1° C. at a certain moment. Temperature sensor 5 detects this temperature, and transmits this information to controller 6. Then, based on the information from controller 6, synthesizer 4 shifts the frequency for 3 ppm.

In the first exemplary embodiment, an output signal of synthesizer 4 is input to frequency converter 3. However, the output signal of synthesizer 4 may be sent to a second synthesizer (not illustrated), and an output signal of the second synthesizer may be input to frequency converter 3. In both cases, a frequency of local oscillation signal input to frequency converter 3 will suddenly change for 3 ppm at a certain moment.

If a frequency of receiving signal output from receiver 7 is 500 MHz, a frequency variation of 3 ppm is equivalent to 1.5 kHz. This immediately becomes a change in intermediate frequency signal output from frequency converter 3. In other words, the intermediate frequency signal input to demodulator 8 changes for 1.5 kHz due to frequency adjustment by controller 6. Demodulator 8 cannot track this change instantaneously, and results in "reception error." Then, after a few moments, AFC (Auto Frequency Control) inside demodulator 8 activates, and reception is recovered. The time until this recovery differs by the structure of demodulator 8.

However, the reception error does not always occur by the frequency variation of intermediate frequency signal. If this frequency variation is below a predetermined value, the reception error does not occur. In other words, demodulator 8 has a tolerance against instantaneous frequency variation (this tolerance is referred to as "frequency variation tracking capability," and expressed as "fv").

The first factor that determines frequency variation tracking capability fv of demodulator 8 is a Doppler tolerance of demodulator 8 (hereafter the Doppler tolerance is expressed as "fd1."). Doppler tolerance fd1 is also called Rayleigh fading tolerance, and is mostly dependent on system modulation and demodulation principles or waveform equalization principle in internal processing of demodulator 8.

In general, system modulation and demodulation principles with large Doppler tolerance sacrifice a data transmission speed. In order to improve the Doppler tolerance also in demodulator 8, a circuit size is increased or a trade-off with degradation in white noise is often needed. For example, if Doppler tolerance fd1 of receiving device 9 used in the first exemplary embodiment is about 100 Hz, demodulator 8 can demodulate an input signal even if receiving device 9 moves at a speed of about 100 km per hour on receiving a frequency of about 1 GHz.

A frequency variation in the receiving signal caused by the Doppler effect becomes a frequency variation in the intermediate frequency signal output from frequency converter 3. Accordingly, if this amount is smaller than fd1, demodulator 8 can demodulate the input signal. In previous steps before demodulator 8, a frequency variation in local oscillation signal input to frequency converter 3 is equivalent to a variation in the intermediate frequency signal output from frequency converter 3. Accordingly, even if a frequency variation momentarily occurs in the local oscillation signal, demodulator 8 can demodulate the input signal if this variation is smaller than fd1.

The second factor that determines frequency variation tracking capability fv of demodulator 8 is a tracking capability of aforementioned AFC. AFC detects and corrects frequency deviation of intermediate frequency signal input to demodulator 8, based on a period of receiving signal output from receiver 7. For example, in digital broadcast in Japan, a broadcast signal is configured with a symbol unit of about 1-milisecond period. This period is called a "symbol period." Demodulator 8 converts the intermediate frequency signal to a baseband signal using internal NCO (Numerical Controlled Oscillator), which is not illustrated. Then, aforementioned symbol period is extracted by using a guard interval signal specified by digital broadcast in Japan. An initial value of NCO is set to a predetermined frequency of intermediate frequency signal. However, if frequency deviation exists in the intermediate frequency signal, a frequency deviation occurs in a baseband signal output from NCO, and thus aforementioned symbol frequency deviates. Therefore, a value set to NCO is corrected so that an extracted symbol period becomes a predetermined value. This corrects deviation in intermediate frequency signal.

A detectable and correctable frequency range (pull-in range) of frequency deviation in the intermediate frequency signal can be made broad (e.g. several tens of kHz). However, to stabilize frequency correction by AFC, integral treatment needs to be applied to correction for each receiving signal period. This makes a tracking time long with respect to the receiving signal period. Accordingly, reception error occurs until AFC completes tracking. The reception error occurs if frequency variation in local oscillation signal caused by temperature compensation control in oscillator unit 1 exceeds fd1, and reception becomes feasible again after a tracking time, which is determined by weight parameters of integral treatment in AFC.

Frequency variation tracking capability fv of demodulator 8 is determined mainly by the aforementioned factors, and depends on system modulation and demodulation principles and a structure of high-frequency receiving device including demodulator 8.

Therefore, the oscillator unit of the present invention focuses attention on this frequency variation tracking capability fv. Controller 6 controls synthesizer 4 using a frequency adjustment unit (hereafter referred to as "fstep") smaller than fv. The fstep refers to a minimum adjustable level for digitally adjusting oscillation frequency. This makes the frequency variation level of intermediate frequency input to demodulator 8 smaller than frequency variation tracking capability fv. Demodulator 8 has tolerance to this frequency variation, and thus makes it feasible to eliminate reception error caused by the temperature compensation control. In addition, since frequency variation tracking capability fv≦Doppler tolerance fd1 is at least established, occurrence of reception error can be suppressed by setting at least frequency adjustment unit fstep smaller than Doppler tolerance fd1, even if frequency variation tracking capability fv cannot be determined at the initial design stage.

Furthermore, frequency adjustment without delay against a temperature change in reference oscillator 2 can be achieved by satisfying a relational expression of Formula 1, whereas N is the number of frequency adjustment per unit time in synthesizer 4, ΔF is a frequency variation level per unit temperature in local oscillation signal, and ΔT is a temperature change per unit time in reference oscillator.

$$N \times f\text{step} > \Delta F \times \Delta T \qquad \text{(Formula 1)}$$

A case of using the above example is detailed next. Since a frequency variation level of reference oscillator 2 per 1° C. is 30 ppm, output from synthesizer 4 becomes 30 kHz per 1° C. (ΔF=30 kHz). If a temperature changes for 0.1° C. per second (ΔT=0.1° C.), a frequency variation of 3 kHz occurs. Here, if frequency adjustment unit fstep is 100 Hz, Formula 1 is satisfied by setting N>30. More specifically, by configuring controller 6 to adjust frequency in a period of 30 times or more per second, the frequency can be adjusted without any demodulation error in demodulator 8 and also without any delay against the temperature change. This structure thus simplifies a device, in particular, a controller, without any complicated control.

Figure 1B:
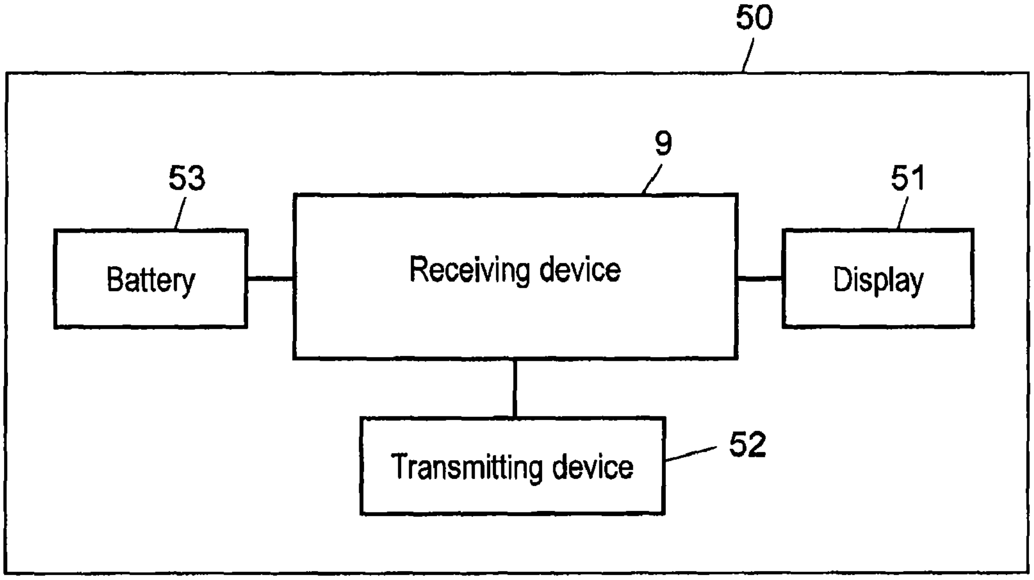
FIG. 1B is a block diagram of an electronic device equipped with the receiving device in accordance with the first exemplary embodiment of the present invention.

FIG. 1B is a block diagram of an electronic device equipped with the receiving device in the first exemplary embodiment of the present invention. In FIG. 1B, electronic device 50 includes receiving device 9, display 51 connected to an output of receiving device 9, transmitting device 52 disposed near receiving device 9, and battery 53 for supplying power to the receiving device. For example, if this receiving device 9 is applied to a mobile phone, one of electronic devices, oscillator unit 1 of the present invention increasingly demonstrates the above effect. Display 51, transmitting device 52, and battery 53 have large influence on the ambient temperature change by their operation and non-operation. For example, if the receiving device in the first exemplary embodiment is fully used independently, a temperature change during its use is 0.05 to 0.1° C./second. However, when the receiving device is installed in a communications device, a temperature changes from 0.1 to 0.3° C./second. Its influence is more than doubled. Accordingly, frequency variation per unit time in the output of synthesizer 4 becomes greater when oscillator unit 1 is installed in an electronic device with display 51. If the frequency variation in the output of synthesizer 4 becomes large, greater frequency adjustment level is consequently needed every time, increasing the probability of causing reception error. Duration of reception error also becomes longer. In the first exemplary embodiment, however, adjustment is applied while retaining the relation of fstep≦fd1. Therefore, the receiving process that does not depend on the temperature change per unit time, and without any reception error becomes feasible. At the same time, the use of Formula 1 makes it feasible to adjust frequency against the temperature change without delay, further increasing the effect of the first exemplary embodiment. Furthermore, the electronic device can be downsized and cost reduction is achievable by providing an input terminal of reference oscillation signal to receiving device 9 and using a reference oscillator outside the receiving device.

As described above, receiving device 9 of the present invention increases its effect when receiving device 9 is installed in electronic device 50. Still more, the oscillator unit of the present invention is effective as an oscillator unit for a transmitting device, in addition to the receiving device. If a frequency variation in a transmitting device also occurs due to temperature compensation control in the oscillator unit, the aforementioned problem also occurs in the receiving device receiving a transmission signal from this transmitting device. Accordingly, communications without transmission and reception errors become feasible by applying frequency adjustment, which is needed in line with a temperature change in the oscillator unit in the transmitting unit, in the unit smaller than Doppler tolerance of the receiving device.

The first exemplary embodiment uses an oscillator unit with a frequency temperature coefficient of 0.6 ppm/° C. or below. However, a required frequency temperature coefficient changes in line with a required frequency variation level in a high-frequency receiving device. In the first exemplary embodiment, the oscillator unit with 0.6 ppm/° C. is adopted because a target frequency stability of the local oscillator in the high-frequency receiving device is set to ±40 ppm, considering a margin against desired stability of ±60 ppm. An oscillator unit with further better frequency stability is applicable. As another example, if the target frequency stability is set to ±6 ppm, the oscillator unit needs to be controlled to achieve at least 0.1 ppm/° C.

Still more, in the first exemplary embodiment, an operating temperature change is 0.05 to 0.1° C./second. However, this change depends on the environment where the device is used and a structure of the device itself. Accordingly, each device is designed appropriate for each case. Controller 6 is not necessarily included in the oscillator unit. It may be included in demodulator 8 in line with a specific structure of receiving device 9. Alternatively, a microcomputer connected to a subsequent step may be used for control.

Furthermore, the first exemplary embodiment refers to a structure of directly connecting synthesizer 4 producing a signal input to the frequency converter and reference oscillator 2. However, if variation in oscillation frequency due to the temperature of reference oscillator 2 is large against system requirements, a first synthesizer is provided after the reference oscillator, a second synthesizer using this output as a reference signal is provided, and an output from the second synthesizer may be input to frequency converter 3. If a filter is provided to the output signal of frequency converter 3, a cutoff frequency of filter may be adjusted when controller 6 adjusts the frequency. This prevents the filter from attenuating all or part of a receiving signal band even if the frequency of output signal from frequency converter 3 varies.

Second Exemplary Embodiment

The second exemplary embodiment of the present invention is described below.

Figure 2:
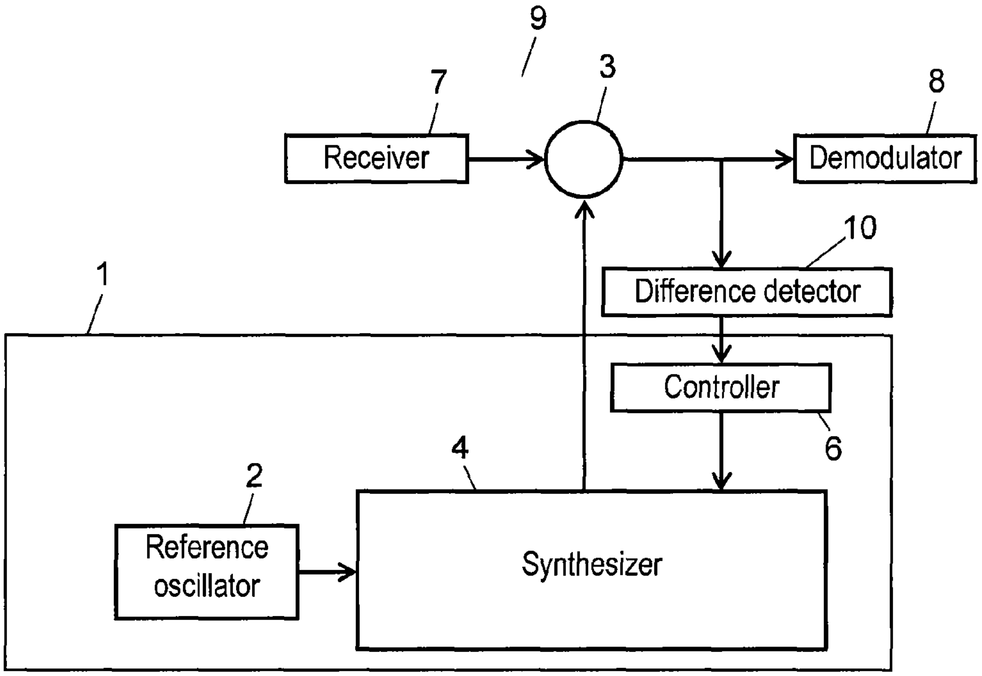
FIG. 2 is a block diagram of a receiving device equipped with an oscillator unit in accordance with a second exemplary embodiment of the present invention.

FIG. 2 is a block diagram of a receiving device equipped with an oscillator unit in the second exemplary embodiment of the present invention. In FIG. 2, oscillator unit 1 includes reference oscillator 2 for producing a reference oscillation signal, synthesizer 4, and controller 6 for adjusting an output frequency of synthesizer 4. Synthesizer 4 produces a local oscillation signal, based on the reference oscillation signal output from reference oscillator 2, and outputs this local oscillation signal to frequency converter 3. Receiving device 9 equipped with this oscillator unit 1 includes oscillator unit 1, receiver 7 for receiving a high-frequency signal, frequency converter 3 connected to oscillator unit 1 and receiver 7 for generating an intermediate frequency signal, demodulator 8 for demodulating the intermediate frequency signal, and difference detector 10 for detecting a difference between an output of frequency converter 3 and a predetermined intermediate frequency. An output of this difference detector 10 is connected to controller 6. Alternatively, difference detector 10 may detect a difference between an output of reference oscillator 2 or an output of synthesizer 4 and a predetermined frequency corresponding to each of them.

In this structure, controller 6 adjusts an output frequency of synthesizer 4 such that an output of difference detector 10 becomes 0. As described in the first exemplary embodiment, a demodulation error occurs if an amount exceeding frequency variation tracking capability fv of demodulator 8 is adjusted instantaneously. Therefore, frequency adjustment unit fstep of synthesizer 4 is set to a value smaller than fv so that demodulation error can be prevented. The frequency of synthesizer 4 can be adjusted, following output frequency variation against a predetermined intermediate frequency, by satisfying a relational expression of Formula 2, whereas N is the number of frequency adjustment per unit time in synthesizer 4, ΔF is a frequency variation per unit temperature in the local oscillation signal, and d is a difference per unit time output from difference detector 10.

$$N \times f\text{step} > d \qquad \text{Formula 2}$$

Receiving device 9 in the second exemplary embodiment eliminates the need of temperature sensor 5, and thus oscillator unit 1 can be further downsized.

Third Exemplary Embodiment

The third exemplary embodiment is described below.

Figure 3:
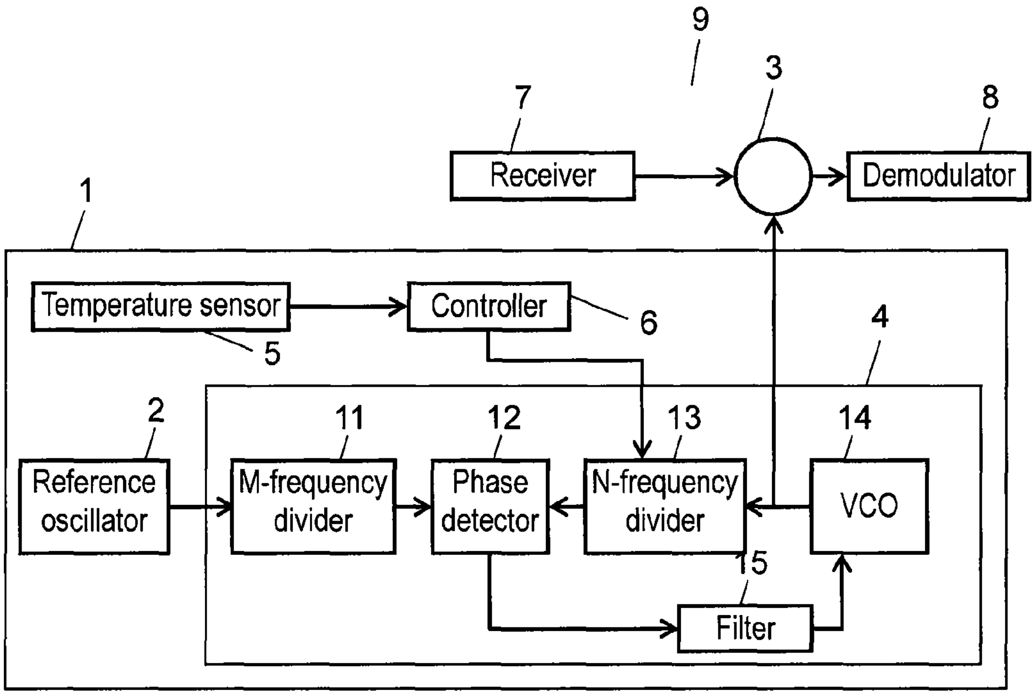
FIG. 3 is a block diagram of a receiving device equipped with an oscillator in accordance with a third exemplary embodiment of the present invention.

FIG. 3 is a block diagram of a receiving device equipped with an oscillator unit in the third exemplary embodiment of the present invention. In FIG. 3, oscillator unit 1 has the same structure as that of the first exemplary embodiment. Synthesizer 4 includes M-frequency divider 11 connected to an output of reference oscillator 2; phase detector 12 connected to this M-frequency divider 11 and an output of N-frequency divider, which is described later; filter 15 connected to an output of phase detector 12; VCO 14 connected to an output of this filter 15; and N-frequency divider connected to an output of this VCO 14. An output terminal of controller 6 is connected to N-frequency divider. Temperature sensor 5 is connected to controller 6. As in the second exemplary embodiment, difference detector 10 may be connected to controller 6.

In this structure, M-frequency divider 11 divides the output of reference oscillator 2 to 1/M frequency, and N-frequency divider 13 divides the output of VCO 14 to 1/N frequency. Phase detector 12 compares output phases of M-frequency divider 11 and N-frequency divider 13, and controls frequency of VCO 14 to achieve 0-phase difference. Frequency fout of local oscillation signal output from synthesizer 4 is determined in accordance with Formula 3 by setting frequency-dividing ratio M of M-frequency divider and frequency-dividing ratio N of N-frequency divider.

$$F\text{out} = (N/M) \times f\text{in} \qquad \text{Formula 3}$$

Here, fin is a frequency of output signal from reference oscillator 2. Fractional numbers may also be set to frequency-dividing ratio N.

For example, if fin is 20 MHz, frequency-dividing ratio M is 2, and predetermined frequency adjustment unit fstep is 100 Hz; the minimum setting unit of $10^{-5}$ (=$100 \times 2/(20 \times 10^6)$) can be set to frequency-dividing ratio N.

As described above, the output frequency of synthesizer 4 can be changed in units smaller than frequency variation tracking capability fv of demodulator 8 by appropriately designing the setting unit for frequency-dividing ratio N and/or frequency-dividing ratio M. A frequency-divider may be disposed between synthesizer 4 and frequency converter 3, depending on a structure of receiving device 9. An object of the present invention is also achieved by controlling this frequency-divider using the fstep unit.

Still more, a large time constant may be set to filter 15 on adjusting frequency by controller 6. This enables suppression of variation in the voltage input to VCO 14 within a predetermined range. As a result, variation in output frequency of synthesizer 4 can be suppressed within a predetermined range.

Furthermore, the output frequency of synthesizer 4 can also be changed by switching capacitance of VCO or controlling offset value of control voltage applied to VCO. In these cases, the output frequency of synthesizer 4 can be changed in the fstep unit by setting appropriate switching unit for capacitance or appropriate resolution power for offset value of control voltage.

Fourth Exemplary Embodiment

The fourth exemplary embodiment of the present invention is described below.

Figure 4:
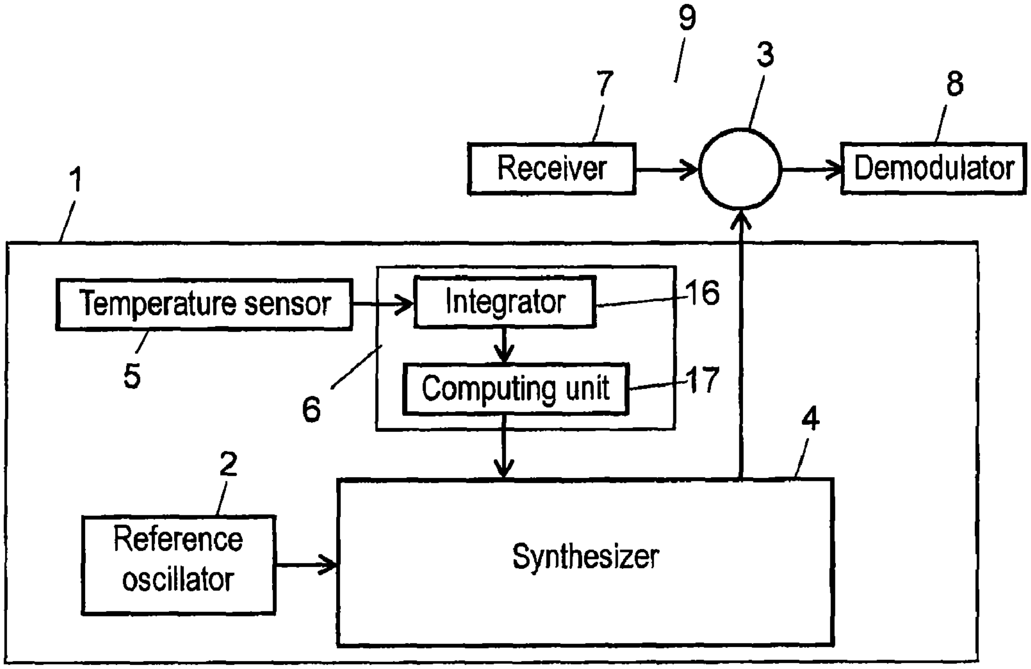
FIG. 4 is a block diagram of a receiving device equipped with an oscillator unit in accordance with a fourth exemplary embodiment of the present invention.

FIG. 4 is a block diagram of a receiving device equipped with an oscillator unit in the fourth exemplary embodiment of the present invention. In FIG. 4, oscillator unit 1 has the same structure as that in the first exemplary embodiment. Controller 6 includes integrator 16 connected to an output of temperature sensor 5, and computing unit 17 connected to an output of integrator 16. Next is described how frequency is adjusted such that frequency adjustment unit fstep of synthesizer 4 becomes smaller than frequency variation tracking capability fv of demodulator 8 in this structure.

Figure 5:
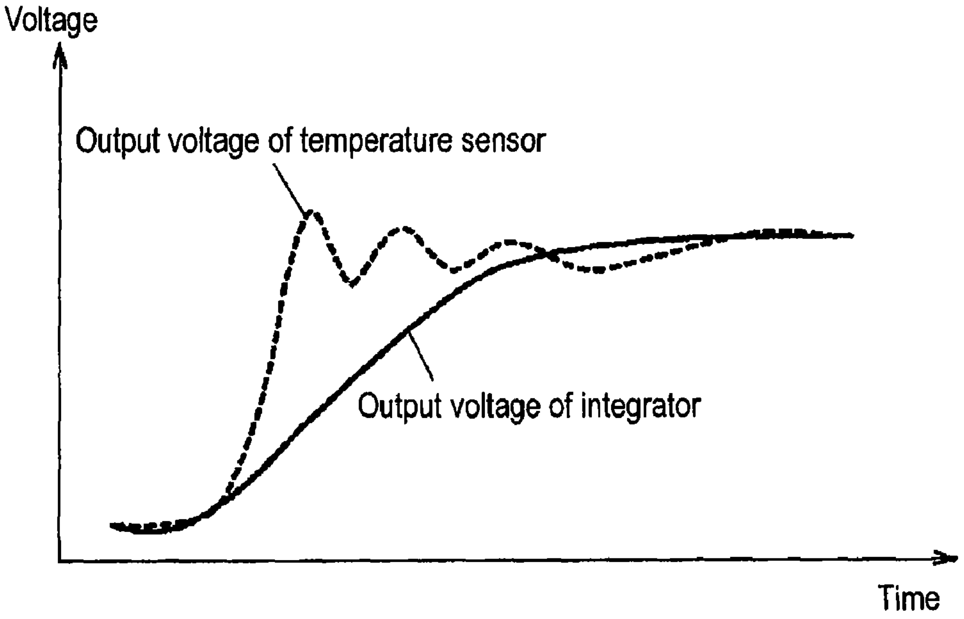
FIG. 5 illustrates changes by time of an output of a temperature sensor and an integrator in the oscillator unit in accordance with the fourth exemplary embodiment of the present invention.

FIG. 5 illustrates changes over time of output of the temperature sensor and the integrator of the oscillator unit in the fourth exemplary embodiment of the present invention. In FIG. 5, temperature sensor 5 outputs a predetermined voltage against a temperature detected by a sensor (not illustrated). In general, the temperature sensor tracks a temperature change early enough, and thus the output voltage from temperature sensor 5 follows a dotted line in FIG. 5 when the temperature suddenly changes. In other words, the output voltage (vertical axis) suddenly rises with respect to time (horizontal axis). In controller 6, computing unit 17 converts this output voltage to a predetermined frequency adjustment level, and controls synthesizer 4. However, if the temperature suddenly changes, the frequency is also controlled to change suddenly, and demodulator 8 may not be feasible to track this change. Accordingly, in the fourth exemplary embodiment, a suddenly rising output voltage is controlled to a moderate change so that demodulator 8 can track, when a sudden temperature change occurs, by making this output voltage pass through integrator 16 with a predetermined time constant. In other words, frequency adjusted by synthesizer 4 per unit time is kept below fstep. This adjustment makes frequency adjustment unit fstep of synthesizer 4 smaller than frequency variation tracking capability fv of demodulator 8. A solid line in FIG. 5 is a control signal waveform output from controller 6.

This integrator may be configured with an analog circuit including a resistor, capacitor, inductor, OP amplifier, and so on. Or, the output voltage of temperature sensor 5 may be converted to digital output by an A/D converter and then apply digital computing for integration. Still more, integrator 16 and computing unit 17 may be disposed in the opposite order so as to apply integration to frequency adjustment level, which is an output of computing unit 17. This also achieves the same object.

Furthermore, a memory (not illustrated) and comparator (not illustrated) may be provided between integrator 16 and computing unit 17 so as to update the output of computing unit 17 only when a difference between an output voltage of integrator 16 and a previous output voltage stored in the memory exceeds a predetermined threshold. This eliminates the frequency adjustment against a faint temperature change, stabilizing an output frequency of synthesizer 4.

In the structure described above, an appropriate time constant set to an integration circuit enables stabilization of output frequency of synthesizer 4 with a simple circuit.

The above refers to the case of connecting temperature sensor 5. However, this concept is applicable to the structure of using difference detector 10 in the second exemplary embodiment. Also in this case, frequency is adjusted only when a difference between the output of integrator connected to an output of difference detector 10 and a previous output of integrator stored in the memory exceeds a predetermined threshold. This stabilizes the output frequency of synthesizer 4.

Fifth Exemplary Embodiment

The fifth exemplary embodiment of the present invention is described below.

Figure 6:
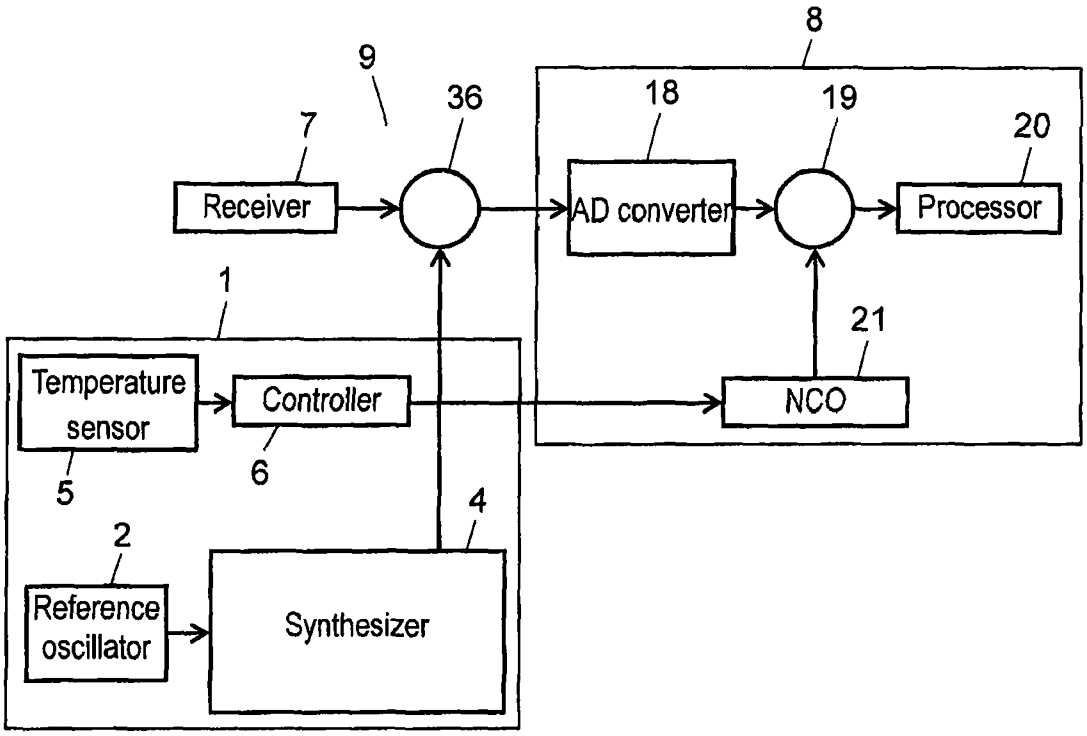
FIG. 6 is a block diagram of a receiving device equipped with an oscillator unit in accordance with a fifth exemplary embodiment of the present invention.
Figure 7:
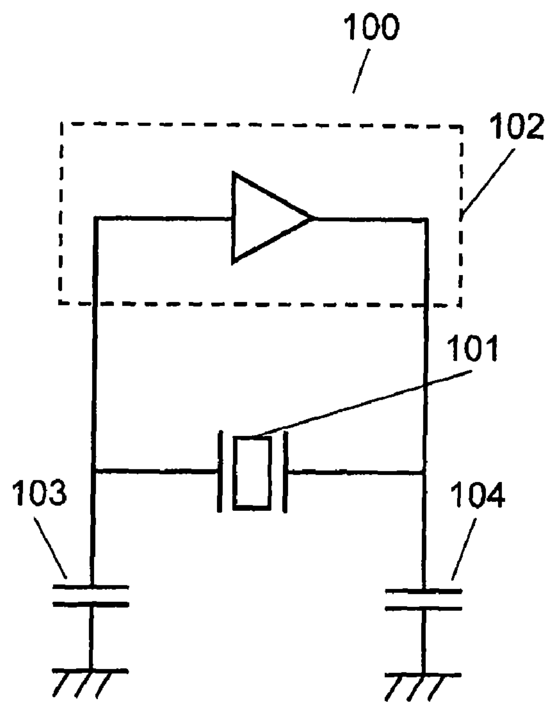
FIG. 7 is a circuit diagram of a conventional reference oscillator.
Figure 8:
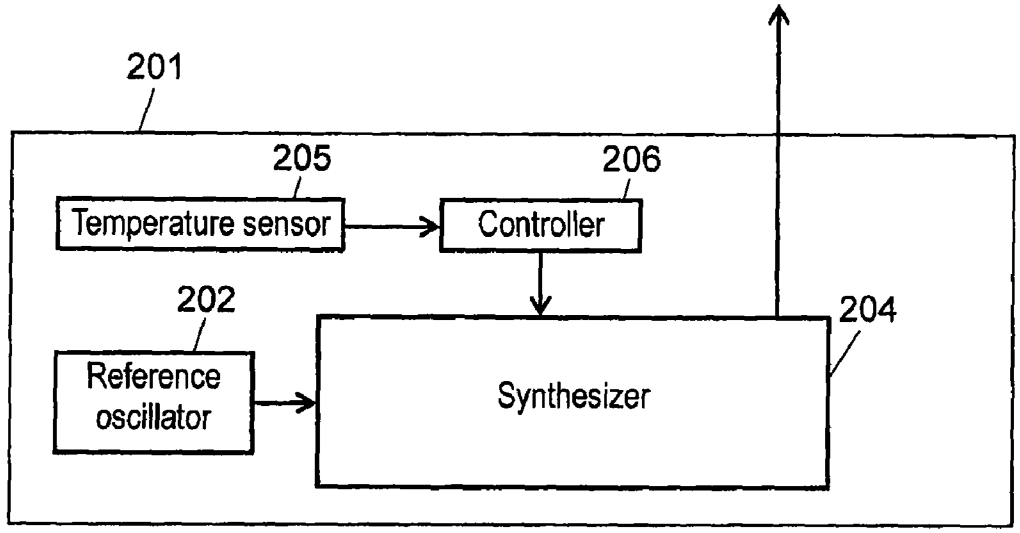
FIG. 8 is a block diagram of a conventional oscillator unit.

FIG. 6 is a block diagram of a receiving device equipped with an oscillator unit in the fifth exemplary embodiment of the present invention. In FIG. 6, oscillator unit 1 has the same structure as that in the first exemplary embodiment. Demodulator 8 includes AD converter 18 connected to an output of first frequency converter 36, NCO 21 for outputting a frequency equivalent to an intermediate frequency, second frequency converter 19 connected to outputs of AD converter 18 and NCO 21, and processor 20 connected to an output of second frequency converter 19. An output of controller 6 is connected to NCO 21 instead of synthesizer 4.

With this structure, controller 6 can stabilize the output frequency of synthesizer 4 also by controlling NCO 21 in accordance with the frequency adjustment condition described in the first exemplary embodiment. Since frequency variation tracking capability fv of demodulator 8 depends on processor 20, an adjustment of output frequency of synthesizer 4 in accordance with a predetermined condition is equivalent to an adjustment of output frequency of NCO 21 in accordance with a predetermined condition for processor 20.

In the above first to third exemplary embodiments, specific values are given to facilitate description. However, a technical feature of the present invention against the prior art is that a frequency variation caused by a temperature coefficient of oscillator in the reference oscillator is adjusted according to a condition determined by the frequency variation tracking capability of demodulator. Accordingly, the oscillator unit of the present invention is applicable to frequency bands used in a range of communications system and specific structures inside receiving devices.

Industrial Applicability

The oscillator unit, receiving device, and electronic device of the present invention enable temperature compensation control that suppresses reception errors by adjusting frequencies in the minimum unit set based on values within an allowable range of frequency variation tracking capability of the demodulator. This allows the use of MEMS (Micro Electro Mechanical System) oscillator made of silicon material with large temperature coefficient for high-frequency receiving devices with small frequency variation tracking capability. Accordingly, the present invention contributes to downsizing and cost reduction of electronic devices, such as mobile terminals and broadcast receivers.

The invention claimed is:

1. A receiving device comprising:

an input terminal of a reference oscillation signal;

a synthesizer for producing a local oscillation signal based on the reference oscillation signal from the input terminal;

a receiver for receiving a signal;

a frequency converter for converting a frequency of an output signal from the receiver by using the local oscillation signal output from the synthesizer;

a demodulator for demodulating a signal output from the frequency converter;

a difference detector for detecting a difference between a frequency of a signal and a predetermined frequency, the signal being output from at least one the input terminal, the synthesizer, and the frequency converter, and a controller for adjusting a frequency of the local oscillation signal output from the synthesizer based on a detection result of the difference detector;

wherein a frequency adjustment unit of the synthesizer used by the controller is smaller than a frequency variation tracking capability of the demodulator.

2. An electronic device comprising:

the receiving device of claim 1;

a decoder connected to an output side of the demodulator; and a display connected to an output side of the decoder.

* * * * *

UNITED STATES PATENT AND TRADEMARK OFFICE

CERTIFICATE OF CORRECTION

PATENT NO. : 8,183,915 B2
APPLICATION NO. : 13/151777
DATED : May 22, 2012
INVENTOR(S) : Yasunobu Tsukio et al.

It is certified that error appears in the above-identified patent and that said Letters Patent is hereby corrected as shown below:

<u>On the Title Page</u>

Item (56), References Cited, FOREIGN PATENT DOCUMENTS, delete "WO PCT/JP2008/002004 9/2008" and enter -- International Search Report for PCT/JP2008/002004 09/2008 --.

Signed and Sealed this
Thirty-first Day of July, 2012

David J. Kappos
*Director of the United States Patent and Trademark Office*